(12) United States Patent
Kinsley

(10) Patent No.: US 10,418,303 B2
(45) Date of Patent: Sep. 17, 2019

(54) SEMICONDUCTOR DIE ASSEMBLY HAVING HEAT SPREADER THAT EXTENDS THROUGH UNDERLYING INTERPOSER AND RELATED TECHNOLOGY

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/106,241

(22) Filed: Aug. 21, 2018

(65) Prior Publication Data

US 2018/0374774 A1  Dec. 27, 2018

Related U.S. Application Data

(63) Continuation of application No. 15/386,343, filed on Dec. 21, 2016, now Pat. No. 10,062,634.

(51) Int. Cl.
*H01L 23/34* (2006.01)
*H01L 23/367* (2006.01)
(Continued)

(52) U.S. Cl.
CPC ...... *H01L 23/3677* (2013.01); *H01L 21/4882* (2013.01); *H01L 23/36* (2013.01);
(Continued)

(58) Field of Classification Search
CPC ............. H01L 23/3677; H01L 21/4882; H01L 23/367; H01L 23/10
(Continued)

(56) References Cited

U.S. PATENT DOCUMENTS 9,053,949 B2  6/2015 Lin
10,062,634 B2 *  8/2018 Kinsley ............... H01L 23/3677
(Continued)

FOREIGN PATENT DOCUMENTS

EP  2631943 A2  8/2013
KR  20150049164 A  5/2015

OTHER PUBLICATIONS

International Application No. PCT/US2017/062621—International Search Report and Written Opinion, dated Mar. 5, 2018, 10 pages.
(Continued)

*Primary Examiner* — Caleb E Henry
(74) *Attorney, Agent, or Firm* — Perkins Coie LLP

(57) ABSTRACT

A semiconductor die assembly in accordance with an embodiment of the present technology includes a first semiconductor die, a package substrate underlying the first semiconductor die, an interposer between the package substrate and the first semiconductor die, and a second semiconductor die between the package substrate and the interposer. The semiconductor die assembly further comprises a heat spreader including a cap thermally coupled to the first semiconductor die at a first elevation, and a pillar thermally coupled to the second semiconductor die at a second elevation different than the first elevation. The heat spreader is configured to transfer heat away from the first and second semiconductor dies via the cap and the pillar, respectively. The interposer extends around at least 75% of a perimeter of the pillar in a plane between the first and second elevations.

19 Claims, 10 Drawing Sheets

(51) Int. Cl.
  *H01L 25/065* (2006.01)
  *H01L 25/00* (2006.01)
  *H01L 21/48* (2006.01)
  *H01L 23/36* (2006.01)
  *H01L 23/42* (2006.01)
  *H01L 23/50* (2006.01)
  *H01L 23/538* (2006.01)

(52) U.S. Cl.
  CPC .............. *H01L 23/42* (2013.01); *H01L 23/50* (2013.01); *H01L 23/5386* (2013.01); *H01L 25/0657* (2013.01); *H01L 25/50* (2013.01); H01L 2225/06548 (2013.01); H01L 2225/06555 (2013.01); H01L 2225/06589 (2013.01)

(58) Field of Classification Search
  USPC ........................................................ 257/713
  See application file for complete search history.

(56) References Cited

U.S. PATENT DOCUMENTS

| | | |
|---|---|---|
| 2006/0087009 A1 | 4/2006 | Yang et al. |
| 2009/0213541 A1 | 8/2009 | Butterbaugh et al. |
| 2010/0019377 A1 | 1/2010 | Arvelo et al. |
| 2013/0093074 A1 | 4/2013 | Grant et al. |
| 2014/0151871 A1 | 6/2014 | Refai-Ahmed et al. |
| 2014/0217610 A1* | 8/2014 | Jeng .................... H01L 23/3128 257/774 |
| 2015/0035135 A1 | 2/2015 | Chen et al. |
| 2015/0162307 A1 | 6/2015 | Chen et al. |
| 2015/0171065 A1 | 6/2015 | McIntosh et al. |
| 2015/0236002 A1 | 8/2015 | Savalia et al. |
| 2016/0211190 A1 | 7/2016 | Braunisch et al. |
| 2016/0254249 A1 | 9/2016 | Hung et al. |
| 2018/0174943 A1* | 6/2018 | Kinsley ............... H01L 23/3677 |
| 2019/0122950 A1* | 4/2019 | Groothuis ............... H01L 23/36 |

OTHER PUBLICATIONS

TW Patent Application No. 106143341—Taiwanese Office Action and Search Report, dated Oct. 30, 2018, with English Translation, 16 pages.

* cited by examiner

SEMICONDUCTOR DIE ASSEMBLY HAVING HEAT SPREADER THAT EXTENDS THROUGH UNDERLYING INTERPOSER AND RELATED TECHNOLOGY

RELATED APPLICATION(S)

This application is a continuation of U.S. application Ser. No. 15/386,343, filed Dec. 21, 2016, which is incorporated herein by reference in its entirety.

TECHNICAL FIELD

The present technology is related to semiconductor die assemblies.

BACKGROUND

Packaged semiconductor dies, including memory chips, microprocessor chips, and imager chips, typically include a singulated die containing semiconductor-based integrated circuity, and a plastic protective covering encasing the die. The die includes functional features, such as memory cells, processor circuits, and imager devices, as well as bond pads electrically connected to the functional features. The bond pads can be electrically connected to terminals outside the protective covering to allow the die to be connected to higher level circuitry. In some cases, multiple semiconductor dies are incorporated into a single package. Individual semiconductor dies in a multiple-die package can have some dedicated packaging features and other packaging features shared with other semiconductor dies in the package. This approach increases the processing capacity, memory, etc. that can be contained in a small space.

Some multiple-die packages include a single stack of vertically aligned semiconductor dies. Other multiple-die packages include semiconductor dies that are laterally offset from one another at the same or different elevations. In these and other types of multiple-die packages, heat dissipation is often a significant design constraint. The combined heat generated by semiconductor dies in a multiple-die package can cause the individual dies to reach temperatures above their maximum operating temperatures. The combined heat may also reduce the performance and reliability of electrical interconnects between the dies. These and other heat-related problems typically become more acute as the density of dies in a multiple-die package increases. Accordingly, enhancing heat dissipation from semiconductor dies in multiple-die packages has the potential to improve performance, improve reliability, and allow for further miniaturization to meet market demands.

DETAILED DESCRIPTION

Figure 1:
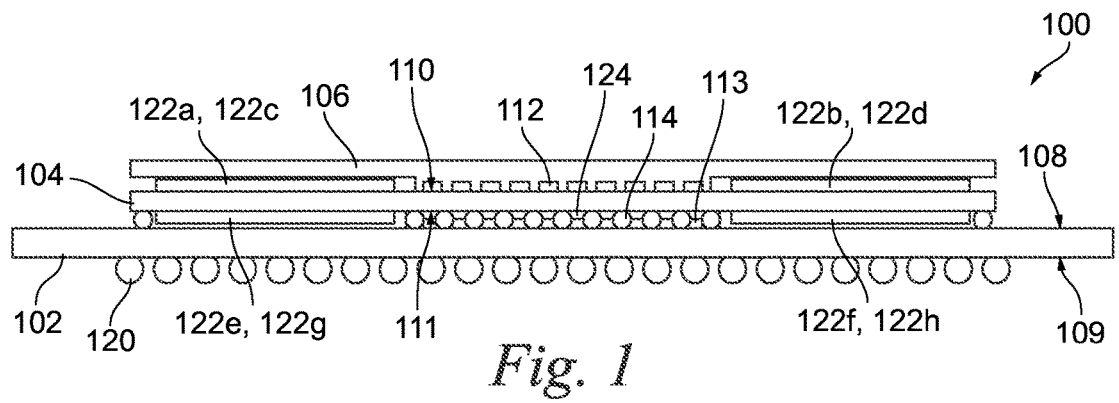
FIG. 1 is a side view of the semiconductor die assembly in accordance with an embodiment of the present technology.

In conventional multiple-die packages, interposers between semiconductor dies at different elevations often interfere with heat dissipation. Conventional interposers are most often made primarily of epoxy resin or another low thermal conductivity material. Therefore, instead of dissipating heat in an upward direction, heat is primarily dissipated from semiconductor dies underlying such interposers in conventional multiple-die packages laterally via relatively thin layers of material overlying and/or underlying the die. For example, capillary underfill material between a package substrate and a die underlying a thermally insulative interposer may serve as the primary pathway for conveying heat away from the die toward a metal casing or another type of external heat spreader. In addition to dissipating heat laterally, it would be desirable to also preferentially dissipate heat vertically.

Semiconductor die assemblies and related devices, systems, and methods in accordance with embodiments of the present technology can at least partially address the foregoing and/or other problems associated with conventional technologies. Semiconductor die assemblies in accordance with at least some embodiments of the present technology include a heat spreader having a cap thermally coupled to a die above an interposer, and a pillar thermally coupled to a die below the interposer. The pillar can extend through an opening in the interposer. In this way, vertical heat dissipation from the die below the interposer can be significantly enhanced. Other advantages in addition to or instead of this advantage also may be present. Furthermore, as described below, semiconductor die assemblies and related devices, systems, and methods in accordance with embodiments of the present technology can have features in addition to or instead of features associated with heat spreading pillars that pass through openings in the associated interposers.

Specific details of semiconductor die assemblies and related devices, systems, and methods in accordance with several embodiments of the present technology are disclosed herein with reference to FIGS. 1-13. Although these embodiments may be disclosed herein primarily or entirely in the context of hybrid assemblies containing logic and memory components, other suitable contexts are within the scope of the present technology. For example, suitable features of disclosed hybrid assemblies can be implemented in the context of memory-only assemblies or in the context of logic-only assemblies. Furthermore, it should be understood, in general, that other devices, systems, and methods in addition to those disclosed herein are within the scope of the present technology. For example, devices, systems, and methods in accordance with embodiments of the present technology can have different and/or additional configurations, components, or procedures than those disclosed herein. Moreover, a person of ordinary skill in the art will understand that devices, systems, and methods in accordance with embodiments of the present technology can be without configurations, components, or procedures disclosed herein without deviating from the present technology.

Figure 2:
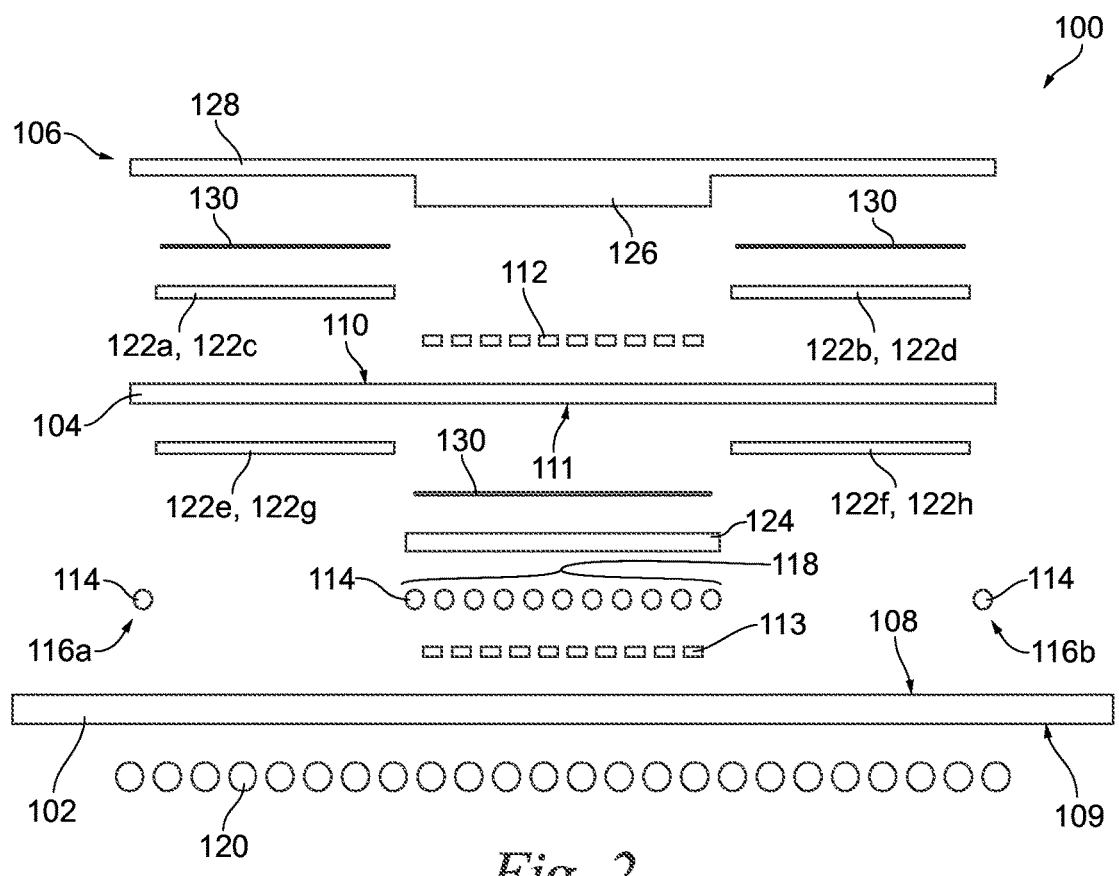
FIGS. 2 and 3 are exploded side views of the semiconductor die assembly shown in FIG. 1.

FIG. 1 is a side view of a semiconductor die assembly 100 in accordance with an embodiment of the present technology, and FIG. 2 is an exploded side view of the semiconductor die assembly 100. With reference to FIGS. 1 and 2 together, the semiconductor die assembly 100 can include a package substrate 102 carrying an interposer 104 and a heat spreader 106. In the orientation shown in FIG. 1, the package substrate 102 has an upper major surface 108 closer to the interposer 104 and a lower major surface 109 father from the interposer 104. Also in the illustrated orientation, the interposer 104 has an upper major surface 110 farther from the package substrate 102 and a lower major surface 111 closer to the package substrate 102. The semiconductor die assembly 100 can include a plurality of first decoupling capacitors 112 (one labeled) electrically connected to the interposer 104, and a plurality of second decoupling capacitors 113 (one labeled) electrically connected to the package substrate 102. The interposer 104 and the package substrate 102 can include internal circuitry (not shown) operably connected to the plurality of first decoupling capacitors 112 and the plurality of second decoupling capacitors 113, respectively.

The semiconductor die assembly 100 can further include laterally spaced apart first solder-ball interconnects 114 electrically coupling the interposer 104 (along its lower major surface 111) to the package substrate 102 (along its upper major surface 108). In the illustrated embodiment, the first solder-ball interconnects 114 are arranged in two peripheral rows 116 (individually identified as rows 116a, 116b in FIG. 2) and a central array 118 (FIG. 2) between the rows 116a, 116b. In other embodiments, counterparts of the first solder-ball interconnects 114 can have other suitable arrangements. In the illustrated embodiment, the semiconductor die assembly 100 further includes laterally spaced apart second solder-ball interconnects 120 (one labeled) electrically coupled to the package substrate 102 along its lower major surface 109. The second solder-ball interconnects 120 can be configured to electrically connect the overall semiconductor die assembly 100 to higher level circuitry (not shown).

As shown in FIGS. 1 and 2, the semiconductor die assembly 100 can include a plurality of first semiconductor dies 122 electrically coupled to the interposer 104. The semiconductor die assembly 100 can further include a second semiconductor die 124 electrically coupled to the package substrate 102. In at least some cases, the plurality of first semiconductor dies 122 are electrically coupled to both the upper major surface 110 and the lower major surface 111 of the interposer 104. For example, at the upper major surface 110 of the interposer 104, the semiconductor die assembly 100 can include four first semiconductor dies 122 (individually identified as first semiconductor dies 122a-122d), and, at the lower major surface 111 of the interposer 104, the semiconductor die assembly 100 can include another four first semiconductor dies 122 (individually identified as first semiconductor dies 122e-122h). (In FIGS. 1 and 2, the first semiconductor dies 122c, 122d, 122g, 122h are hidden behind the first semiconductor dies 122a, 122b, 122e, 122f.) The first semiconductor dies 122a-122d can be laterally offset from one another at one elevation, and the first semiconductor dies 122e-122h can be laterally offset from one another at another elevation. Electrical couplings between the first semiconductor dies 122a-122h and the interposer 104 and between the second semiconductor die 124 and the package substrate 102 are omitted for clarity of illustration. In other embodiments, a counterpart of the semiconductor die assembly 100 can include a different number and/or arrangement of first and second semiconductor dies, such as an arrangement in which first semiconductor dies are electrically connected to only one of two major surfaces of an associated interposer.

In some cases, some or all of the first semiconductor dies 122a-122h are memory dies and the second semiconductor die 124 is a logic die. In these and other cases, heat generated by the second semiconductor die 124 may be significantly greater than heat generated by the plurality of first semiconductor dies 122 during normal operation of the semiconductor die assembly 100. The semiconductor die assembly 100 can include features that facilitate efficient vertical dissipation of the heat generated by the second semiconductor die 124 when the semiconductor die assembly 100 is in the illustrated orientation (e.g., upward with respect to the horizontal orientation of the package substrate 102 in FIG. 1). As shown in FIG. 2, the heat spreader 106 can include a pillar 126 and a cap 128 extending around the pillar 126 (e.g., extending around at least 75% of a perimeter of the pillar 126). The cap 128 can be positioned to be thermally coupled to the first semiconductor dies 122a-122d at one elevation, and the pillar 126 can be positioned to be thermally coupled to the second semiconductor die 124 at another elevation. When the semiconductor die assembly 100 is in the illustrated orientation, the elevation at which the cap 128 is thermally coupled to the first semiconductor dies 122a-122d is above the interposer 104, and the elevation at which the pillar 126 is thermally coupled to the second semiconductor die 124 is below the interposer 104. The pillar 126 can extend through a plane occupied by the interposer 104 (e.g., the pillar 126 can extend through an opening in the interposer 104). In the illustrated embodiment, the pillar 126 and the cap 128 are integral components of the heat spreader 106. In other embodiments, a counterpart heat spreader 106 can include a pillar and a cap that are separate components coupled together or are non-contiguous (e.g., spaced apart from each other). For example, a counterpart heat spreader 106 can include a pillar that extends through an opening at least partially defined by a corresponding cap such that the cap extends around at least 75% of a perimeter of the pillar. Other noncontiguous configurations are also possible.

With reference again to FIGS. 1 and 2 together, the semiconductor die assembly 100 can further include thermal interface features 130 (FIG. 2) through which the heat spreader 106 is thermally coupled to the first semiconductor dies 122a-122d and to the second semiconductor die 124. Some of the thermal interface features 130 can be directly connected to upper surfaces of the first semiconductor dies 122a-122d, respectively, and to corresponding portions of a lower surface of the cap 128 when the semiconductor die assembly 100 is in the illustrated orientation. Another one of the thermal interface features 130 can be directly connected to an upper surface of the second semiconductor die 124 and to a lower surface of the pillar 126 when the semiconductor die assembly 100 is in the illustrated orientation. The heat spreader 106 can be shaped such that an elevation difference between the lower surface of the cap 128 and the lower surface of the pillar 126 corresponds to an elevation difference between the upper surfaces of the first semiconductor dies 122a-122d and the upper surface of the second semiconductor die 124 when the semiconductor die assembly 100 is in the illustrated orientation. The thermal interface features 130 can be configured to fill voids and to smooth irregularities at interfaces between the heat spreader 106 and the first semiconductor dies 122a-122d and between the heat spreader 106 and the second semiconductor die 124. In the illustrated embodiment, the thermal interface features 130 are volumes of thermal interface paste, such as silicone-based grease doped with thermally conductive particles. In other embodiments, counterparts of one, some, or all of the thermal interface features 130 can be pieces of thermal interface tape or have another suitable form to enhance thermal conductivity and/or to secure the heat spreader 106 to the first semiconductor dies 122a-122d and to the second semiconductor die 124.

Figure 3:
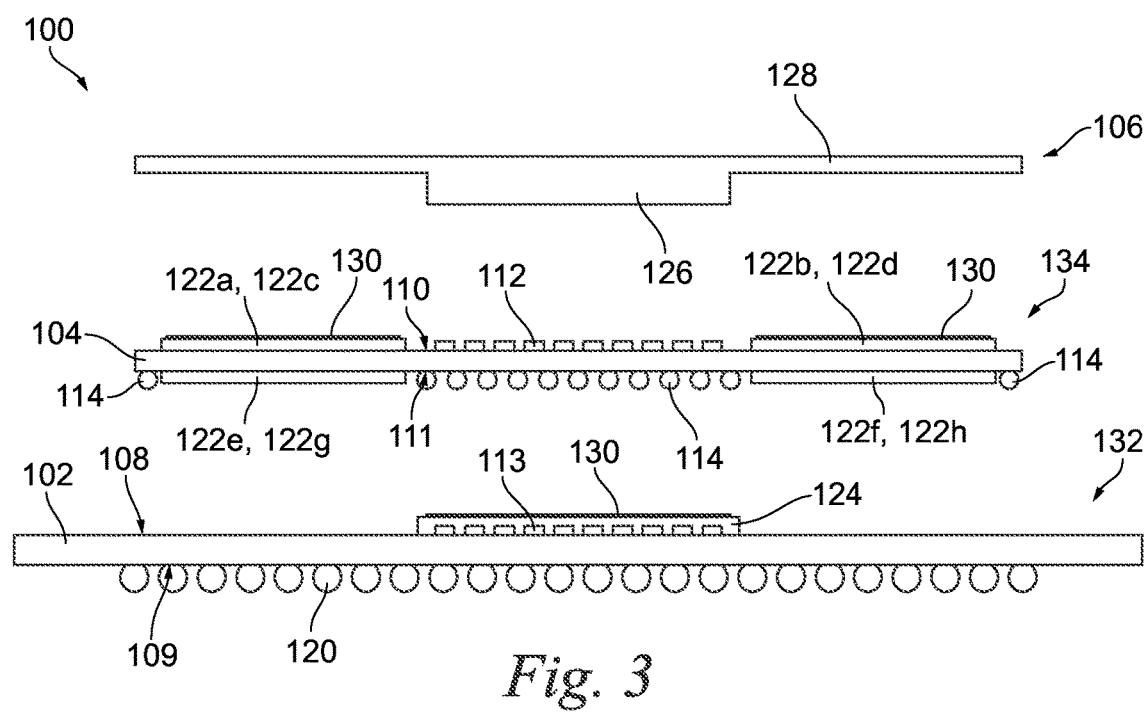
Figure 4:
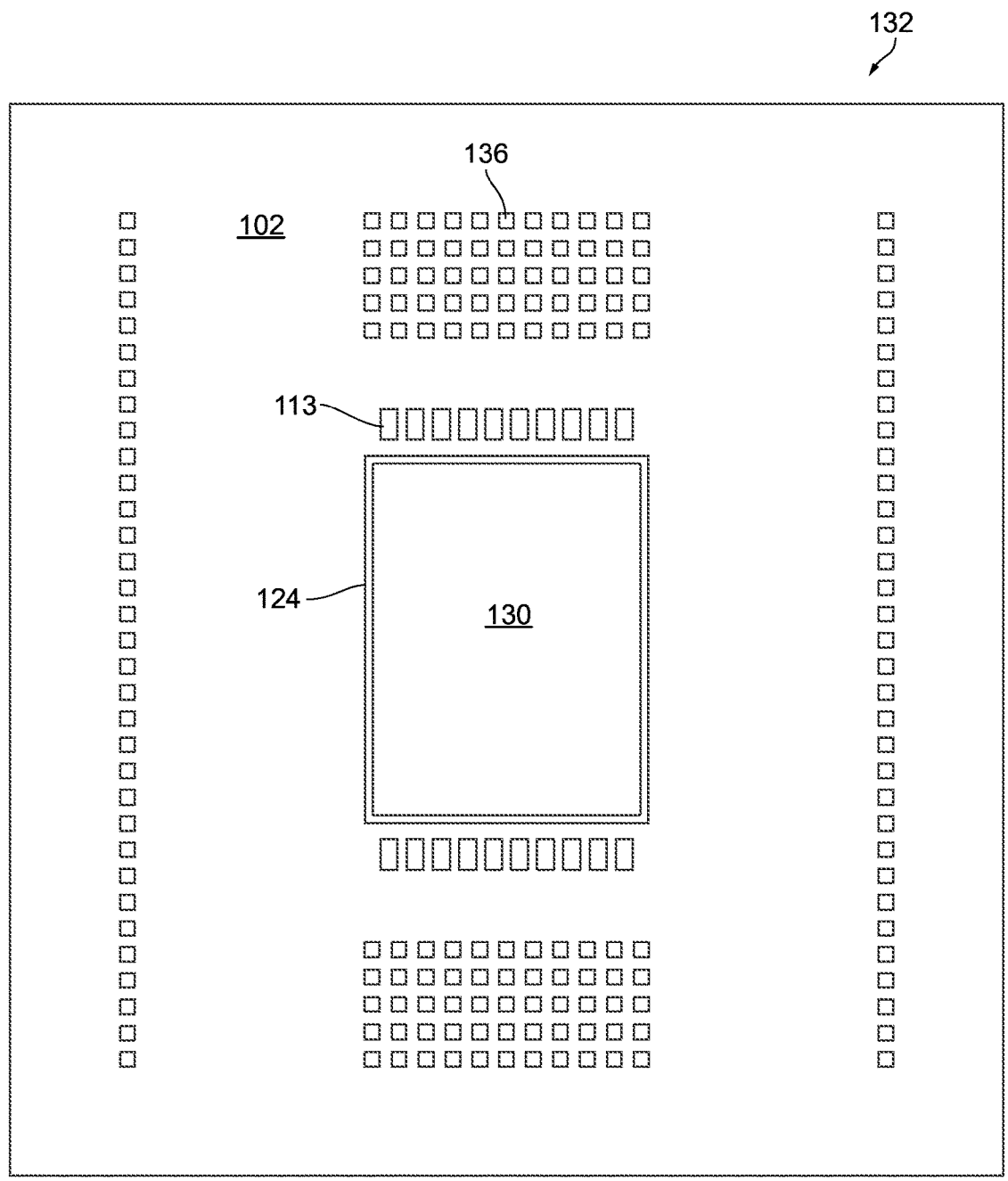
FIG. 4 is a top plan view of a lower subassembly of the semiconductor die assembly shown in FIG. 1.

FIG. 3 is another exploded view of the semiconductor die assembly 100. As shown in FIG. 3, the semiconductor die assembly 100 can include a lower subassembly 132 and an upper subassembly 134 configured to be assembled with the heat spreader 106. The lower subassembly 132 can include the package substrate 102, the second decoupling capacitors 113, the second solder-ball interconnects 120, the second semiconductor die 124, and the thermal interface feature 130 associated with the second semiconductor die 124. The upper subassembly 134 can include the interposer 104, the first decoupling capacitors 112, the first solder-ball interconnects 114, the plurality of first semiconductor dies 122, and the thermal interface features 130 associated with the plurality of first semiconductor dies 122. FIG. 4 is a top plan view of the lower subassembly 132. As shown in FIG. 4, the package substrate 102 can include bond pads 136 (one labeled) vertically aligned with the first solder-ball interconnects 114. The second semiconductor die 124 can be centrally positioned on the package substrate 102.

Figure 5:
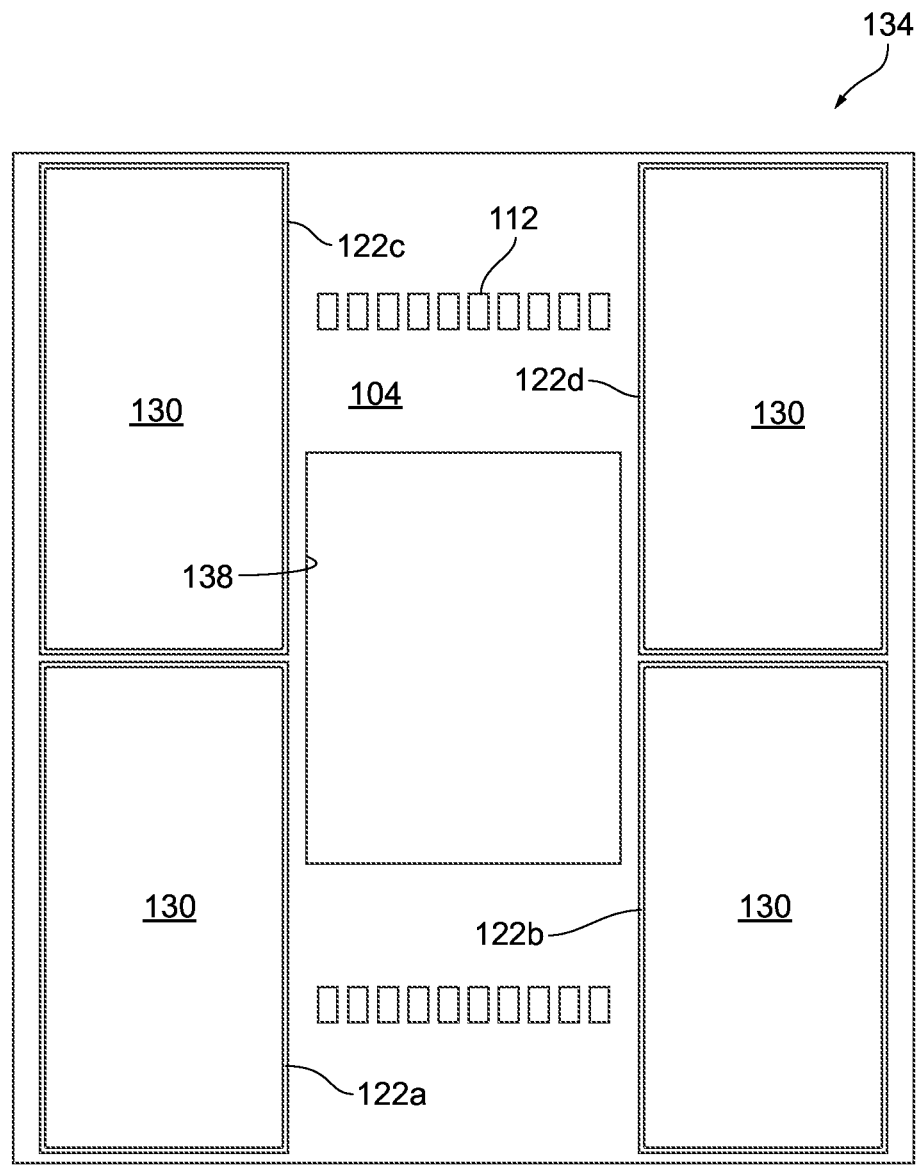
FIG. 5 is a top plan view of an upper subassembly of the semiconductor die assembly shown in FIG. 1.

FIG. 5 is a top plan view of the upper subassembly 134. As shown in FIG. 5, the interposer 104 can define an opening 138 configured to be vertically aligned with the second semiconductor die 124 when the lower and upper assemblies 132 and 134 are arranged as shown in FIG. 3. The first semiconductor dies 122a, 122c are at one side of the opening 138 and the first semiconductor dies 122b, 122d are at an opposite side of the opening 138. When the lower and upper subassemblies 132, 134 and the heat spreader 106 are assembled, the pillar 126 can extend through the opening 138. Thus, the first semiconductor dies 122a, 122c can be laterally spaced apart from the pillar 126 in one direction while the first semiconductor dies 122b, 122d are laterally spaced apart from the pillar 126 in an opposite direction. In the illustrated embodiment, the interposer 104 is shaped as a rectangular annulus and, therefore, extends around an entire perimeter of the pillar 126. In other embodiments, a counterpart of the interposer 104 can extend around less than all (e.g., less than 100%, but greater than 75%) of a perimeter of the pillar 126. As one example, a counterpart of the interposer 104 can be U-shaped.

Figure 6:
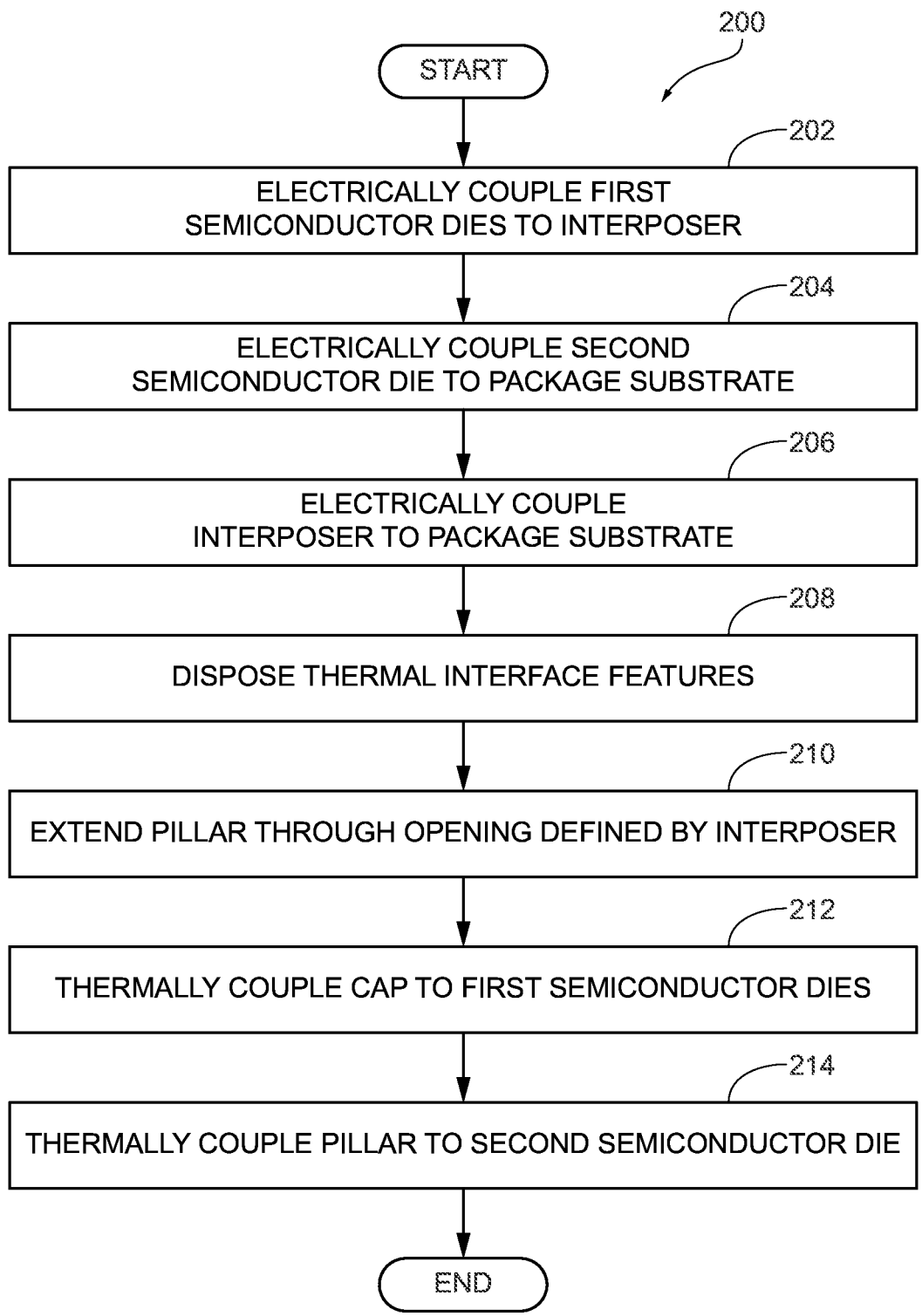
FIG. 6 is a flow chart illustrating a method for making the semiconductor die assembly shown in FIG. 1 in accordance with an embodiment of the present technology.

FIG. 6 is a flow chart illustrating a method 200 for making the semiconductor die assembly 100 in accordance with an embodiment of the present technology. With reference to FIGS. 1-6 together, the method 200 can include electrically coupling the first semiconductor dies 122a-122h to the interposer 104 (block 202) and electrically coupling the second semiconductor die 124 to the package substrate 102 (block 204). Electrically coupling the first semiconductor dies 122a-122h to the interposer 104 can include electrically coupling the first semiconductor dies 122a-122d via the upper major surface 110 of the interposer 104 and/or electrically coupling the first semiconductor dies 122e-122h via the lower major surface 111 of the interposer 104. The method 200 can further include electrically coupling the interposer 104 to the package substrate 102 (block 206) and disposing the thermal interface features 130 (block 208) in direct contact with respective ones of the first semiconductor dies 122a-122d and the second semiconductor die 124. For example, volumes of thermal interface paste or pieces of thermal interface tape can be disposed at respective upper surfaces of the first semiconductor dies 122a-122d and the second semiconductor die 124. The method 200 can also include locating the heat spreader 106 relative to the interposer 104, which can include extending the pillar 126 through the opening 138 (block 210). In conjunction with locating the heat spreader 106 relative to the interposer 104, the method 200 can include thermally coupling the cap 128 to the first semiconductor dies 122a-122d (block 212) and thermally coupling the pillar 126 to the second semiconductor die 124 (block 214) via the corresponding thermal interface features 130. When the thermal interface features 130 include volumes of thermal interface paste, the heat spreader 106 can compress and laterally expand the volumes of thermal interface paste. After the heat spreader 106 is suitably positioned, the volumes of thermal interface paste can be cured (e.g., thermally cured) to secure the heat spreader 106.

Figure 7:
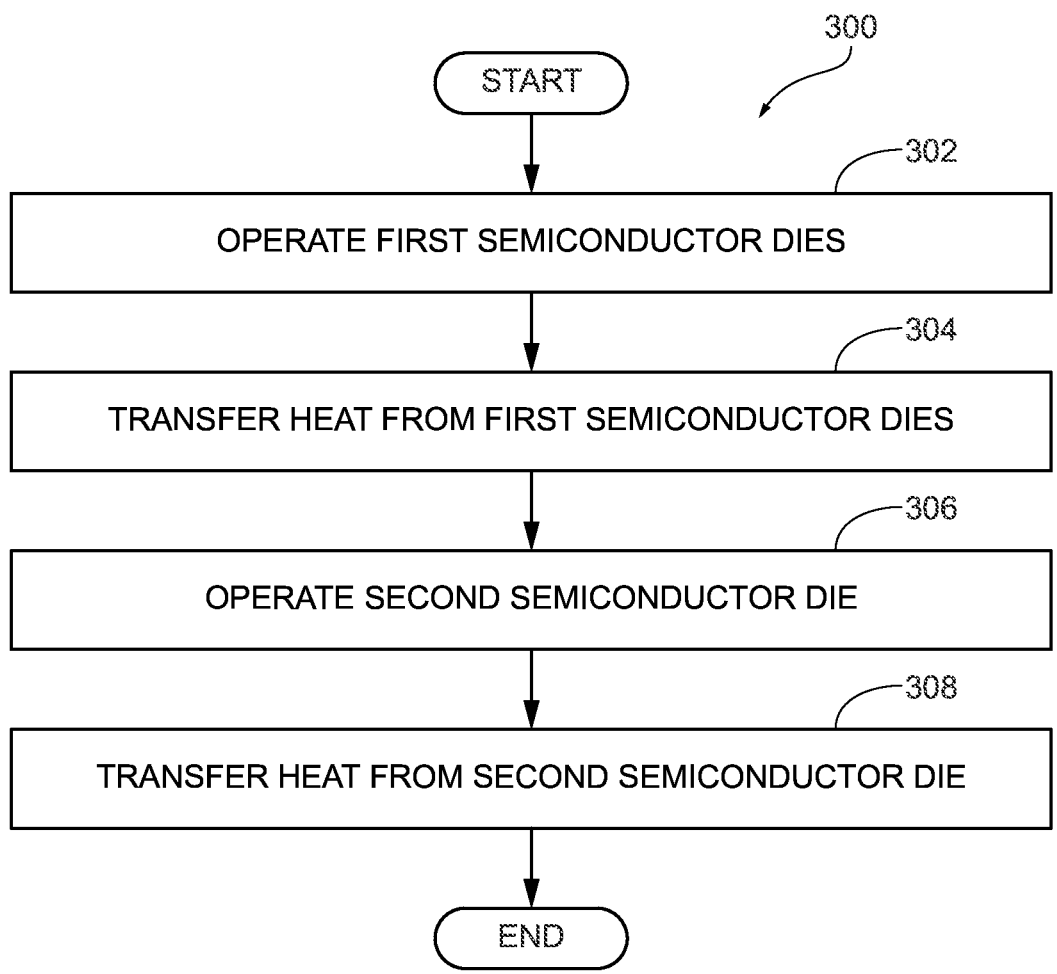
FIG. 7 is a flow chart illustrating a method for operating the semiconductor die assembly shown in FIG. 1 in accordance with an embodiment of the present technology.

FIG. 7 is a flow chart illustrating a method 300 for operating the semiconductor die assembly 100 in accordance with an embodiment of the present technology. With reference to FIGS. 1-5 and 7 together, the method 300 can include operating the plurality of first semiconductor dies 122 (block 302). The method 300 can further include transferring heat generated by operating the plurality of first semiconductor dies 122 away from the plurality of first semiconductor dies 122 (block 304). In at least some cases, most (e.g., at least 50% or at least 75%) of the heat generated by operating the first semiconductor dies 122a-122d is dissipated through the cap 128. The method 300 can further include operating the second semiconductor die 124 (block 306). The total heat generated by operating the second semiconductor die 124 can be significantly greater (e.g., at least 4 times greater) than the total heat generated by operating any one of the first semiconductor dies 122a-122h. The method 300 can further include transferring heat generated by operating the second semiconductor die 124 away from the second semiconductor die 124 (block 308). In at least some cases, most (e.g., at least 50% or at least 75%) of the heat generated by operating the second semiconductor die 124 is dissipated through the pillar 126 and through the opening 138. The sequence of die operation may vary, e.g., operation of the plurality of first semiconductor dies 122 and operation of the second semiconductor die 124 may be in reverse order and/or simultaneous.

Figure 8:
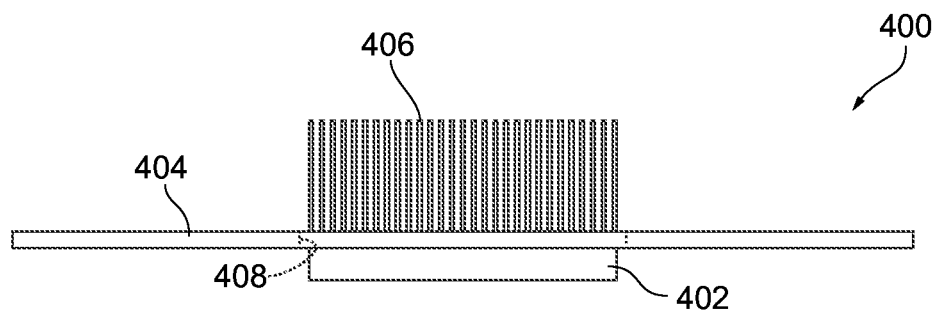
FIG. 8 is a side view of a heat spreader of a semiconductor die assembly in accordance with another embodiment of the present technology.
Figure 9:
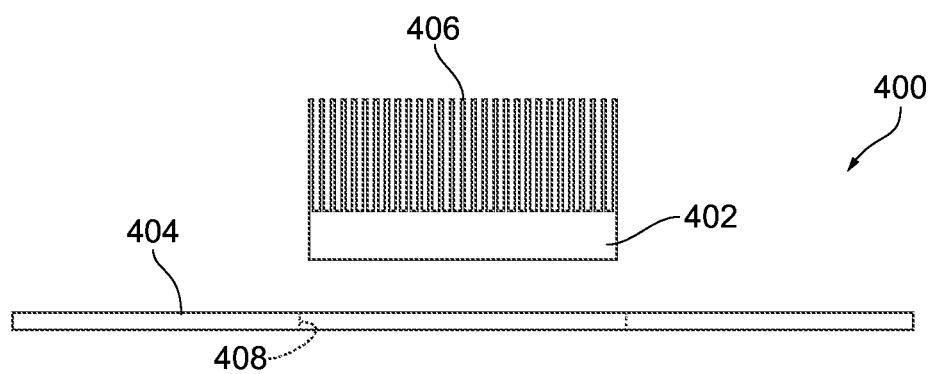
FIG. 9 is an exploded side view of the heat spreader shown in FIG. 8.
Figure 10:
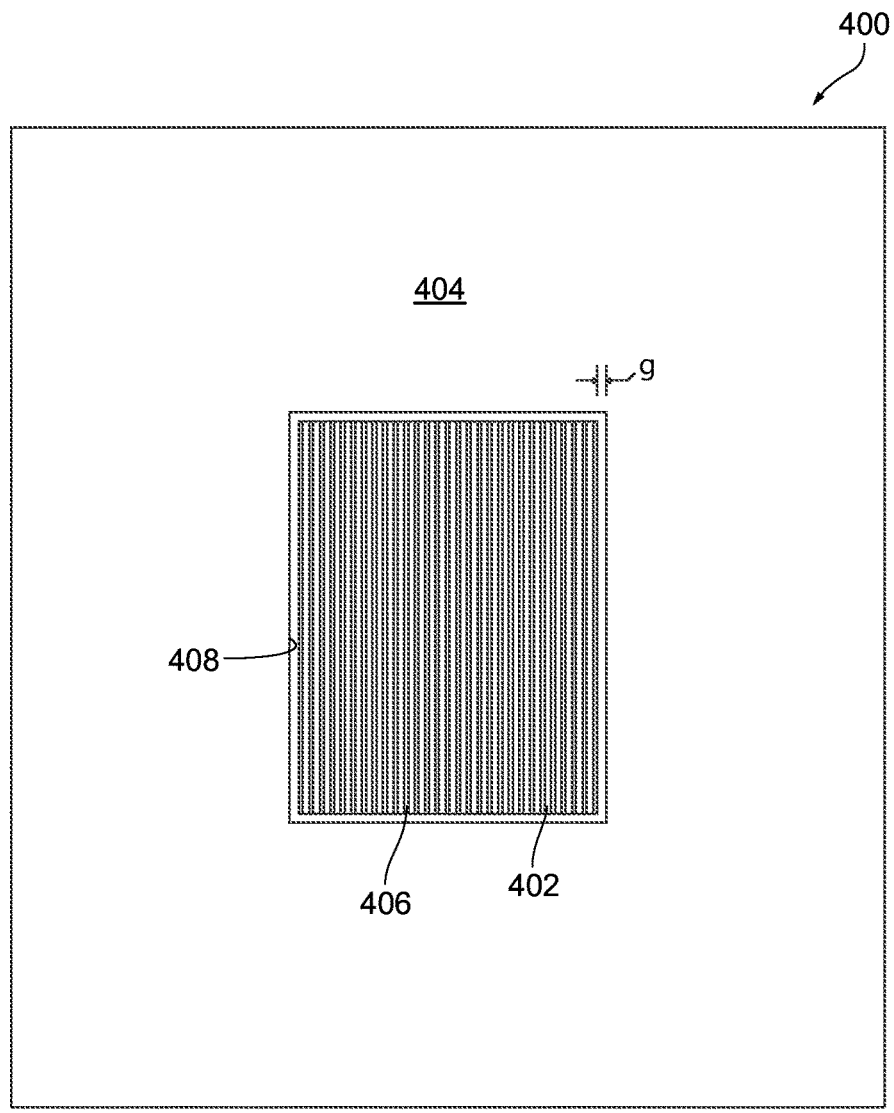
FIG. 10 is a top plan view of the heat spreader shown in FIG. 8.

FIGS. 8, 9 and 10 are a side view, an exploded side view, and a top plan view of a heat spreader 400 of a semiconductor die assembly in accordance with another embodiment of the present technology. With reference to FIGS. 8-10 together, the heat spreader 400 can include a pillar 402 and a cap 404 having an opening 408 (shown in dashed lines) extending around the pillar 402 (e.g., extending around at least 75% of a perimeter of the pillar 402). The heat spreader 400 can further include fins 406 carried by the pillar 402. The fins 406 can be configured to transfer heat generated by the second semiconductor die 124 by convection. Unlike the pillar 126 and the cap 128 of the heat spreader 106 (FIGS. 1-3), the pillar 402 and the cap 404 of the heat spreader 400 can be noncontiguous. For example, the pillar 402 extends through the opening 408 (FIG. 10) such that a small gap "g" is between the pillar 402 and the cap 404. In the illustrated embodiment, the heat spreader 400 does not include fins carried by the cap 404. The gap may be useful, for example, to facilitate manufacturing and/or to provide thermal separation between the cap 404 and the pillar 402. In other embodiments, a counterpart of the heat spreader 400 can include fins carried by a counterpart of the cap 404 in addition to or instead of the fins 406 carried by the pillar 402. Furthermore, rods or other types of convection enhancing structures can be used in place of fins in other embodiments.

Figure 11:
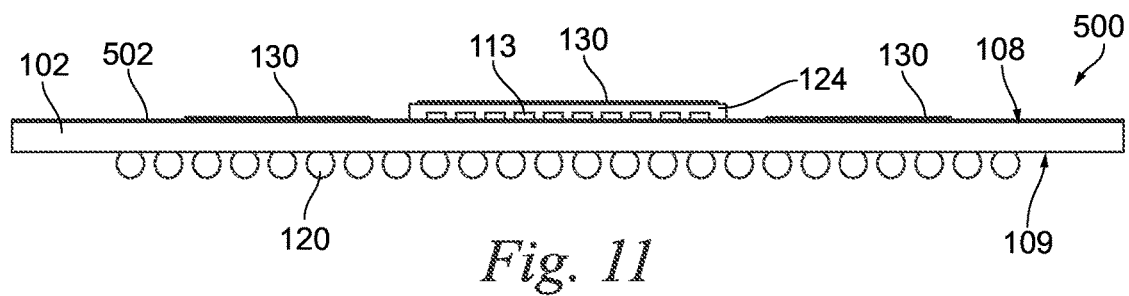
FIG. 11 is a side view of a lower subassembly of a semiconductor die assembly in accordance with another embodiment of the present technology.
Figure 12:
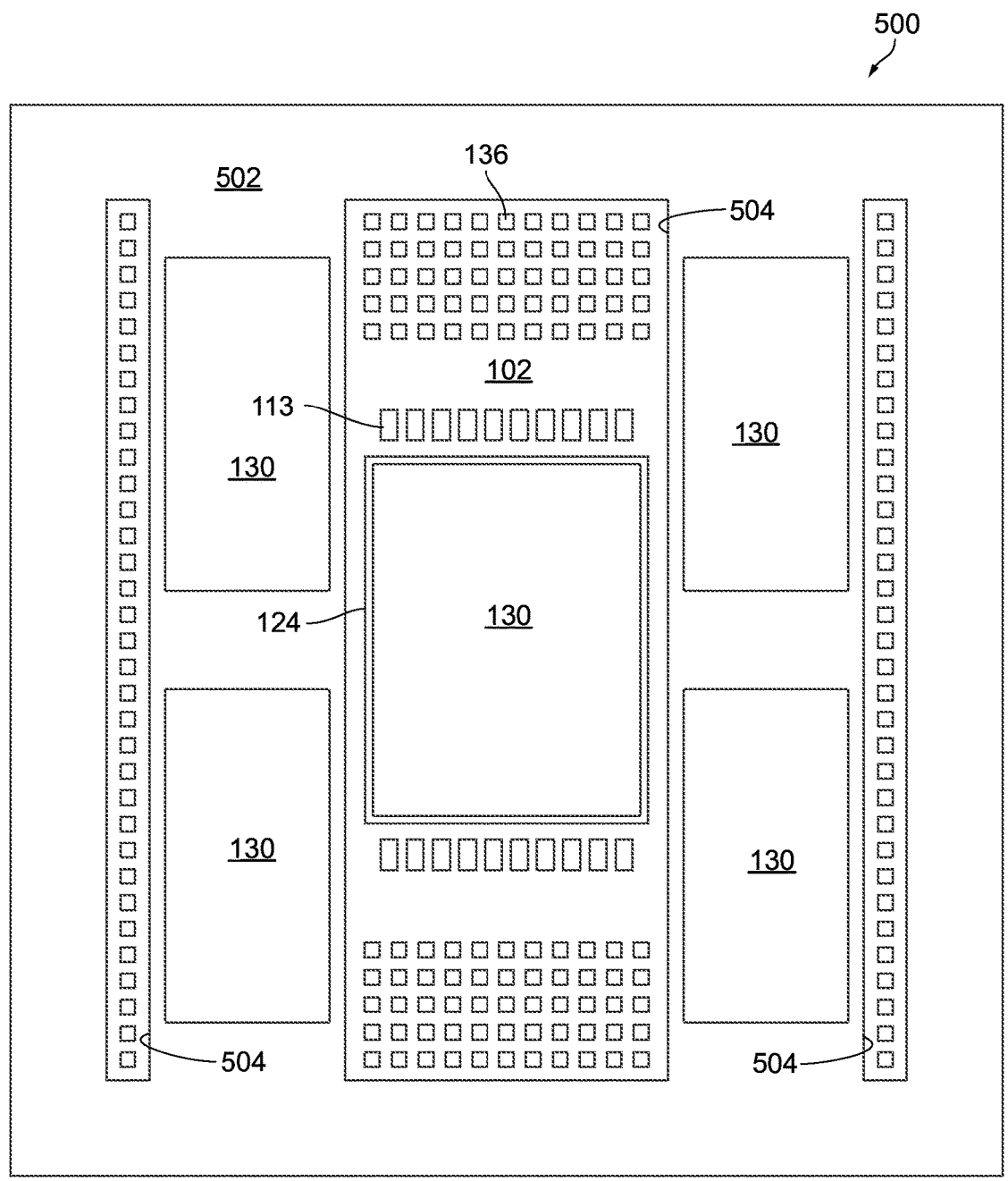
FIG. 12 is a top plan view of the lower subassembly shown in FIG. 11.

FIG. 11 is a side view of a lower subassembly 500 of a semiconductor die assembly in accordance with another embodiment of the present technology, and FIG. 12 is a top plan view of the lower subassembly 500. With reference to FIGS. 11 and 12 together, the lower subassembly 500 can include a heat transfer material 502 at the upper major surface 108 of the package substrate 102. In at least some cases, the heat transfer material 502 is a metal film overlying the package substrate 102. The heat transfer material 502 can include cutouts 504 (FIG. 12) around the bond pads 136. The lower subassembly 500 can further include additional thermal interface features 130 (e.g., pieces of thermal interface tape or volumes of thermal interface paste) overlying the heat transfer material 502. With reference to FIGS. 3, 11 and 12 together, the lower subassembly 500 can be assembled with the upper subassembly 134 and the heat spreader 106. When so assembled, the first semiconductor dies 122e-122h can be thermally coupled to the heat transfer material 502 via the additional thermal interface features 130. The heat transfer material 502 can define a primary pathway for transferring most (e.g., at least 50% or at least 75%) of heat generated by operating the first semiconductor dies 122e-122h away from the first semiconductor dies 122e-122h. The transferred heat can then be dissipated at a peripheral portion of the heat transfer material 502 extending laterally beyond an edge portion of the interposer 104. In the illustrated embodiment, the lower subassembly 500 does not include convection enhancing structures at its peripheral portion. In other embodiments, a counterpart of the lower subassembly 500 can include fins, pillars, or other convection enhancing structures at the peripheral portion of the heat transfer material 502 and/or at another suitable location. In these and other embodiments, the heat transfer material 502 may be used without the heat spreader 106.

Figure 13:
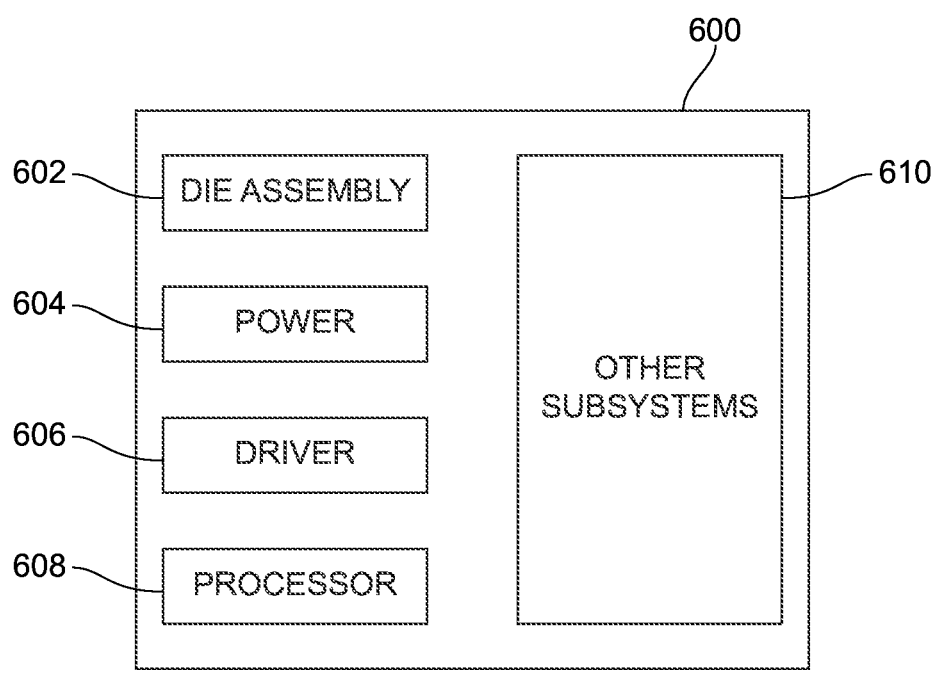
FIG. 13 is a schematic view of a system that includes a semiconductor die assembly in accordance with an embodiment of the present technology

Any one of the semiconductor die assemblies described above with reference to FIGS. 1-12 can be incorporated into any of a myriad of larger and/or more complex systems, a representative example of which is system 600 shown schematically in FIG. 13. The system 600 can include a semiconductor die assembly 602, a power source 604, a driver 606, a processor 608, and/or other subsystems or components 610. The semiconductor die assembly 602 can include features generally similar to those of the semiconductor die assemblies described above, and can therefore include a heat spreading pillar that passes through an opening defined by an associated interposer. The resulting system 600 can perform any of a wide variety of functions, such as memory storage, data processing, and/or other suitable functions. Accordingly, representative systems 600 can include, without limitation, hand-held devices (e.g., mobile phones, tablets, digital readers, and digital audio players), computers, and appliances. Components of the system 600 may be housed in a single unit or distributed over multiple, inter-connected units (e.g., through a communications network). The components of the system 600 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown and/or described in detail to avoid unnecessarily obscuring the description of the embodiments of the present technology. Although steps of methods may be presented herein in a particular order, in alternative embodiments the steps may have another suitable order. Similarly, certain aspects of the present technology disclosed in the context of particular embodiments can be combined or eliminated in other embodiments. Furthermore, while advantages associated with certain embodiments may have been disclosed in the context of those embodiments, other embodiments may also exhibit such advantages, and not all embodiments need necessarily exhibit such advantages or other advantages disclosed herein to fall within the scope of the present technology.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising" and the like may be used herein to mean including at least the recited feature(s) such that any greater number of the same feature(s) and/or one or more additional types of features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not all referring to the same embodiment. Furthermore, various particular features, structures, operations, or characteristics may be combined in any suitable manner in one or more embodiments of the present technology.

I claim:

1. A semiconductor die assembly, comprising:
   a first semiconductor die having a first major surface and an opposite second major surface;
   a package substrate underlying the first semiconductor die when the semiconductor die assembly is in a given orientation;
   an interposer between the package substrate and the first semiconductor die, wherein the interposer has a first major surface and an opposite second major surface, and wherein the first semiconductor die is electrically coupled to the interposer via the first major surface of the interposer;
   a second semiconductor die having a first major surface and an opposite second major surface, wherein the package substrate is electrically coupled to the second semiconductor die via the second major surface of the second semiconductor die, and wherein the first major surface of the second semiconductor die is below the first major surface of the interposer when the semiconductor die assembly is in the given orientation; and
a heat spreader configured to transfer heat away from the first and second semiconductor dies, wherein the heat spreader includes—
a cap thermally coupled to the first semiconductor die via the first major surface of the first semiconductor die, and
a pillar thermally coupled to the second semiconductor die via the first major surface of the second semiconductor die, wherein the interposer extends around at least a majority of a perimeter of the pillar in a plane parallel to the first major surface of the interposer.

2. The semiconductor die assembly of claim 1 wherein:
the interposer defines an opening; and
the pillar extends through the opening.

3. The semiconductor die assembly of claim 1 wherein the interposer is shaped as a rectangular annulus.

4. The semiconductor die assembly of claim 1 wherein:
the first semiconductor die is a memory die; and
the second semiconductor die is a logic die.

5. The semiconductor die assembly of claim 1 wherein:
the heat spreader includes fins configured to transfer heat by convection; and
the fins are above the pillar when the semiconductor die assembly is in the given orientation.

6. The semiconductor die assembly of claim 1 wherein the cap and the pillar are contiguous components of the heat spreader.

7. The semiconductor die assembly of claim 1 wherein:
the first semiconductor die is a first one of a plurality of first semiconductor dies electrically coupled to the interposer;
the first one of the plurality of first semiconductor dies is laterally spaced apart from the pillar in a first direction;
the semiconductor die assembly further comprises a second one of the plurality of first semiconductor dies; and
the second one of the plurality of first semiconductor dies is laterally spaced apart from the pillar in a second direction opposite to the first direction.

8. The semiconductor die assembly of claim 1 further comprising:
a first thermal interface feature through which the cap is thermally coupled to the first semiconductor die; and
a second thermal interface feature through which the pillar is thermally coupled to the second semiconductor die, wherein the second thermal interface feature is below the first major surface of the interposer when the semiconductor die assembly is in the given orientation.

9. The semiconductor die assembly of claim 8 wherein the first and second thermal interface features are, respectively, first and second pieces of thermal interface tape.

10. The semiconductor die assembly of claim 8 wherein the first and second thermal interface features are, respectively, first and second volumes of thermal interface paste.

11. The semiconductor die assembly of claim 1 wherein:
the first semiconductor die is a first one of a plurality of first semiconductor dies electrically coupled to the interposer;
the semiconductor die assembly further comprises a second one of the plurality of first semiconductor dies; and
the second one of the plurality of first semiconductor dies is electrically coupled to the interposer via the second major surface of the interposer.

12. The semiconductor die assembly of claim 11, further comprising heat transfer material between the package substrate and the second one of the plurality of first semiconductor dies, wherein the heat transfer material is thermally coupled to the second one of the plurality of first semiconductor dies.

13. The semiconductor die assembly of claim 12 wherein the heat transfer material is a metal film overlying the package substrate when the semiconductor die assembly is in the given orientation.

14. The semiconductor die assembly of claim 12 further comprising a thermal interface feature through which the heat transfer material is thermally coupled to the second one of the plurality of first semiconductor dies.

15. The semiconductor die assembly of claim 14 wherein the thermal interface feature is a piece of thermal interface tape.

16. The semiconductor die assembly of claim 14 wherein the thermal interface feature is a volume of thermal interface paste.

17. A method for making a semiconductor die assembly, the method comprising:
electrically coupling a first semiconductor die to an interposer via a major surface of the interposer;
electrically coupling a second semiconductor die to a package substrate;
thermally coupling a cap of a heat spreader to the first semiconductor die, wherein the heat spreader is configured to transfer heat away from the first semiconductor die via the cap;
locating a pillar of the heat spreader relative to the interposer such that the interposer extends around at least 75% of a perimeter of the pillar, wherein the heat spreader is configured to transfer heat away from the second semiconductor die via the pillar; and
thermally coupling the pillar of the heat spreader to the second semiconductor die via a major surface of the second semiconductor die, wherein the major surface of the second semiconductor die is inset toward the package substrate relative to the major surface of the interposer.

18. The method of claim 17 wherein:
the interposer defines an opening; and
locating the pillar relative to the interposer includes extending the pillar through the opening.

19. A semiconductor die assembly, comprising:
a first semiconductor die having a first major surface and an opposite second major surface;
a package substrate underlying the first semiconductor die when the semiconductor die assembly is in a given orientation;
a single interposer between the package substrate and the first semiconductor die, wherein the interposer has a first major surface, an opposite second major surface, and an opening extending from the first major surface to the second major surface, and wherein the first semiconductor die is electrically coupled to the interposer via the first major surface of the interposer;
a second semiconductor die having a first major surface and an opposite second major surface, wherein the package substrate is electrically coupled to the second semiconductor die via the second major surface of the second semiconductor die, and wherein the first major surface of the second semiconductor die is below the first major surface of the interposer when the semiconductor die assembly is in the given orientation; and a heat spreader configured to transfer heat away from the first and second semiconductor dies, wherein the heat spreader includes— a cap thermally coupled to the first semiconductor die via the first major surface of the first semiconductor die, and a pillar thermally coupled to the second semiconductor die via the first major surface of the second semiconductor die, wherein the pillar extending through the opening of the interposer.

\* \* \* \* \*